(12) United States Patent
Shinomiya

(10) Patent No.: US 6,560,759 B2
(45) Date of Patent: May 6, 2003

(54) SEMICONDUCTOR INTEGRATED CIRCUIT DEVICE, DESIGN METHOD FOR THE SAME AND COMPUTER-READABLE RECORDING WHERE MEDIUM I/O CELL LIBRARY IS RECORDED

(75) Inventor: Noriko Shinomiya, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 60 days.

(21) Appl. No.: 09/781,233

(22) Filed: Feb. 13, 2001

(65) Prior Publication Data

US 2001/0015447 A1 Aug. 23, 2001

(30) Foreign Application Priority Data

Feb. 22, 2000 (JP) .......................... 2000-044014

(51) Int. Cl.[7] .............................................. G06F 17/50
(52) U.S. Cl. ............................................... 716/8; 716/1
(58) Field of Search .................. 716/8, 1–14; 257/202, 257/356, 355

(56) References Cited

U.S. PATENT DOCUMENTS

| | | | | |
|---|---|---|---|---|
| 4,988,636 A | * | 1/1991 | Masleid et al. ............. 438/129 |
| 5,535,084 A | * | 7/1996 | Nakayama ................... 257/356 |
| 5,751,051 A | | 5/1998 | Hayano ....................... 257/546 |
| 5,760,428 A | * | 6/1998 | Colwell et al. ............. 257/202 |
| 6,048,753 A | * | 4/2000 | Farnworth et al. .......... 438/111 |
| 6,104,588 A | * | 8/2000 | Hariton et al. .............. 361/111 |
| 6,140,682 A | * | 10/2000 | Liu et al. ..................... 257/355 |
| 6,397,376 B1 | * | 5/2002 | Sakurai et al. ................ 716/15 |

FOREIGN PATENT DOCUMENTS

JP   5-218204   8/1993

* cited by examiner

*Primary Examiner*—Vuthe Siek
*Assistant Examiner*—Sun James Lin
(74) *Attorney, Agent, or Firm*—McDermott, Will & Emery

(57) ABSTRACT

In a semiconductor integrated circuit device, at least one I/O cell can be disposed in a desired position within a chip. The semiconductor integrated circuit device includes an ESD protection circuit separated from the I/O cell and disposed in an ESD protection circuit region provided in a peripheral portion of the chip; the I/O cell disposed closer to the center of the chip than the ESD protection circuit region; and a wire for connecting the I/O cell to the ESD protection circuit.

20 Claims, 15 Drawing Sheets

SEMICONDUCTOR INTEGRATED CIRCUIT DEVICE, DESIGN METHOD FOR THE SAME AND COMPUTER-READABLE RECORDING WHERE MEDIUM I/O CELL LIBRARY IS RECORDED

BACKGROUND OF THE INVENTION

The present invention relates to a semiconductor integrated circuit device in which an I/O cell can be disposed in a desired position within a chip, a design method for the same and a computer-readable recording medium in which an I/O cell library is recorded.

Recently, a development to build a whole system on one chip, namely, a system on chip technique, has been advanced. As a result, in accordance with increase in scale of semiconductor integrated circuits, the number of pins included in a semiconductor integrated circuit tends to increase.

In order to cope with the increased number of pins, a semiconductor integrated circuit device using bumps arranged in the form of a matrix within a chip, namely, area bumps, has been proposed. Furthermore, as a result of the appearance of the area bumps, a technique to provide I/O cells to be connected to the area bumps in desired positions within the chip has been proposed.

Now, a conventional semiconductor integrated circuit device having an area bump structure disclosed in Japanese Laid-Open Patent Publication No. 5-218204 will be described with reference to FIG. 13. Herein, an internal circuit cell means a basic cell in a gate array type semiconductor integrated circuit and a standard cell in a standard cell type semiconductor integrated circuit.

As is shown in FIG. 13, bumps (area bumps) 11 are arranged in the form of a matrix within a chip 10, and an I/O cell 12 is disposed below each bump 11 in the chip 10 so as to be inserted between cell lines 13 corresponding to lines of internal circuit cells (not shown), namely, so as to be buried between the internal circuit cells.

Furthermore, an internal circuit cell region $R_{CELL}$ where the internal circuit cells are arranged extends over the entire chip 10.

In the semiconductor integrated circuit device using the area bumps, however, since the I/O cells are inserted in the internal circuit cell region, the area of the internal circuit cell region is increased, which increases the total line length of inter-cell wires (wires for connecting the internal circuit cells to each other and wires for connecting the internal circuit cells to the I/O cells). Therefore, propagation delay time of signals is increased in the entire semiconductor integrated circuit (LSI), which causes a problem of a low operation speed of the LSI.

SUMMARY OF THE INVENTION

In consideration of the aforementioned conventional problem, an object of the invention is, in a semiconductor integrated circuit device in which an I/O cell can be disposed in a desired position within a chip, reducing the total line length of inter-cell wires by reducing the area of an internal circuit cell region.

In order to achieve the object, the present inventors have examined the layout of I/O cells.

Now, conventional I/O cells will be described with reference to FIGS. 14 and 15.

FIG. 14 is a schematic diagram for showing the layout of a conventional input I/O cell (hereinafter referred to as the input cell).

As is shown in FIG. 14, the input cell 12a includes a first partial circuit 21 composed of an input buffer and a logic circuit, an input ESD (electrostatic discharge) protection circuit 22 and an input pad 23. The input pad 23 is connected to a corresponding bump 11 by soldering or the like.

FIG. 15 is a schematic diagram for showing the layout of a conventional output I/O cell (hereinafter referred to as the output cell).

As is shown in FIG. 15, the output cell 12b includes a second partial circuit 24 composed of an output pre-buffer and a logic circuit, an output ESD protection circuit 25 and an output pad 26. The output pad 26 is connected to a corresponding bump 11, by soldering or the like.

The output cell 12b is different from the input cell 12a in the output ESD protection circuit 25 including an output buffer/ESD protection circuit 25a working also as an output buffer and an ESD protection dedicated circuit 25b not working as the output buffer.

ESD is a phenomenon that an LSI is damaged by momentary flow of a large current (surge current) derived from static electricity caused when the LSI is touched by a man during wafer fabrication or the like. Therefore, the ESD protection circuit is characterized by use of a transistor having a much larger size than a transistor used in the internal circuit cell so as to withstand a large current exceeding 1 A. Accordingly, the ESD protection circuit occupies the most of the area of the I/O cell.

The circuit is typically not powered during ESD events. Under normal operating condition, i.e., when the chip is powered up, the input ESD protection circuit 22 and the ESD protection dedicated circuit 25b do not affect the operation of the LSI and the output buffer/ESD protection circuit 25a works as the output buffer alone.

The output buffer/ESD protection circuit 25a transfers a signal of the chip 10 through the bump 11 to the outside of the chip 10, and hence, the output buffer/ESD protection circuit 25a is required to have large driving power. Also, when a distance between the output buffer/ESD protection circuit 25a and the bump 11 is large, a signal transfer rate between the bump 11 and the output cell 12b is lowered, and therefore, the distance between the output buffer/ESD protection circuit 25a and the bump 11 should be as small as possible.

The present invention was devised on the basis of the aforementioned findings, and specifically, the semiconductor integrated circuit device of this invention in which at least one I/O cell is able to be disposed in a desired position within a chip, comprises an ESD protection circuit separated from the I/O cell and disposed in an ESD protection circuit region provided in a peripheral portion of the chip; the I/O cell disposed closer to a center of the chip than the ESD protection circuit region; and a wire for connecting the I/O cell to the ESD protection circuit.

In the present semiconductor integrated circuit device, the ESD protection circuit that occupies the most of the area of a conventional I/O cell is separated from the I/O cell so as to be disposed in the ESD protection circuit region provided in the peripheral portion of the chip, and the I/O cell is disposed closer to the center of the chip than the ESD protection circuit region. Therefore, even when the I/O cell is inserted in an internal circuit cell region, the area of the internal circuit cell region can be reduced as compared with that in a conventional semiconductor integrated circuit device, resulting in reducing the total line length of inter-cell wires. Accordingly, propagation delay time of signals can be reduced in the entire LSI, resulting in realizing a high operation speed of the LSI.

In the semiconductor integrated circuit device, it is preferred that the I/O cell is an input cell or a power cell, and that the whole of the ESD protection circuit is separated from the I/O cell to be disposed in the ESD protection circuit region and is connected to the I/O cell through the wire.

In this manner, the area of the internal circuit cell region can be further reduced.

In the semiconductor integrated circuit device, it is preferred that the I/O cell is an output cell, and that an ESD protection dedicated circuit corresponding to a portion of the ESD protection circuit not working as an output buffer is separated from the I/O cell to be disposed in the ESD protection circuit region and is connected to the I/O cell through the wire.

In this manner, the area of the internal circuit cell region can be reduced without increasing signal transfer time between the I/O cell and a bump provided above the I/O cell.

The design method of this invention for a semiconductor integrated circuit device in which one or more I/O cells are able to be disposed in desired positions within a chip, comprises a first arrangement step of arranging the I/O cells and one or more internal circuit cells within the chip; a first wiring step of connecting the internal circuit cells arranged in the first arrangement step to each other or to the I/O cells through inter-cell wires; a second arrangement step of arranging one or more ESD protection circuits separated from the I/O cells in an ESD protection circuit region provided in a peripheral portion of the chip; and a second wiring step of connecting the I/O cells arranged in the first arrangement step to the ESD protection circuits arranged in the second arrangement step through ESD protection wires, and the I/O cells are disposed closer to a center of the chip than the ESD protection circuit region in the first arrangement step.

In the present design method for a semiconductor integrated circuit device, the ESD protection circuit that occupies the most of the area of a conventional I/O cell is separated from the I/O cell so as to be disposed in the ESD protection circuit region provided in the peripheral portion of the chip, and the I/O cell is disposed closer to the center of the chip than the ESD protection circuit region. Therefore, even when the I/O cell is inserted in an internal circuit cell region, the area of the internal circuit cell region can be reduced as compared with that in a conventional semiconductor integrated circuit device, so as to reduce the total line length of inter-cell wires. Accordingly, the propagation delay time of signals can be reduced in the entire LSI, resulting in realizing a high operation speed of the LSI.

Preferably, the design method for a semiconductor integrated circuit device further comprises, between the first wiring step and the second arrangement step, a layout abstraction step of drawing an inclusion line surrounding all of the I/O cells arranged in the first arrangement step and grating lines each extending between the I/O cells or between one of the I/O cells and the inclusion line, and defining a capacity of every grating line corresponding to the number of ESD protection wires permitted to cross the grating line; and an I/O cell allocation step of drawing, with respect to every I/O cell, an I/O cell allocation line extending between the I/O cell and a point on the inclusion line in a manner that the I/O cell allocation line does not cross another I/O cell allocation line and that the number of I/O cell allocation lines crossing every grating line does not exceed the capacity, and the ESD protection circuits are disposed in accordance with the order of the I/O cells each allocated to one point on the inclusion line by using the I/O cell allocation lines in the second arrangement step, and the ESD protection wires are provided in a single interconnection layer alone in the second wiring step.

In this manner, the ESD protection circuits separated from the I/O cells can be disposed so that the ESD protection wires can be provided on a single interconnection layer alone. Therefore, increase of the fabrication cost derived from increase of interconnection layers for providing the ESD protection wires can be avoided.

In the design method for a semiconductor integrated circuit device, it is preferred that the first wiring step includes a sub-step of providing, within the chip, a wire region where the inter-cell wires are disposed, that the design method further includes, between the first wiring step and the second arrangement step, a wire region detection step of detecting the wire region provided in the first wiring step, and that the second arrangement step includes a sub-step of disposing the ESD protection circuits in the wire region detected in the wire region detection step.

In this manner, the area of the ESD protection circuit region provided in the peripheral portion of the chip can be reduced, so as to reduce the area of the chip itself. As a result, the fabrication cost can be lowered and the yield can be improved.

In the computer-readable recording medium of this invention, an I/O cell library corresponding to a set of I/O cells for externally inputting a signal to or outputting a signal from a semiconductor integrated circuit is recorded, and the I/O cell library includes at least one ESD protection circuit separated from the I/O cells as a cell different from the I/O cells.

According to the present computer-readable recording medium, the design method for a semiconductor integrated circuit device of this invention can be easily practiced by utilizing the I/O cell library recorded in the recording medium on a computer.

DETAILED DESCRIPTION OF THE INVENTION

Embodiment 1

A semiconductor integrated circuit device, specifically, a semiconductor integrated circuit device in which an I/O cell can be disposed in a desired position within a chip, according to Embodiment 1 of the invention will now be described with reference to the accompanying drawings.

Figure 1:
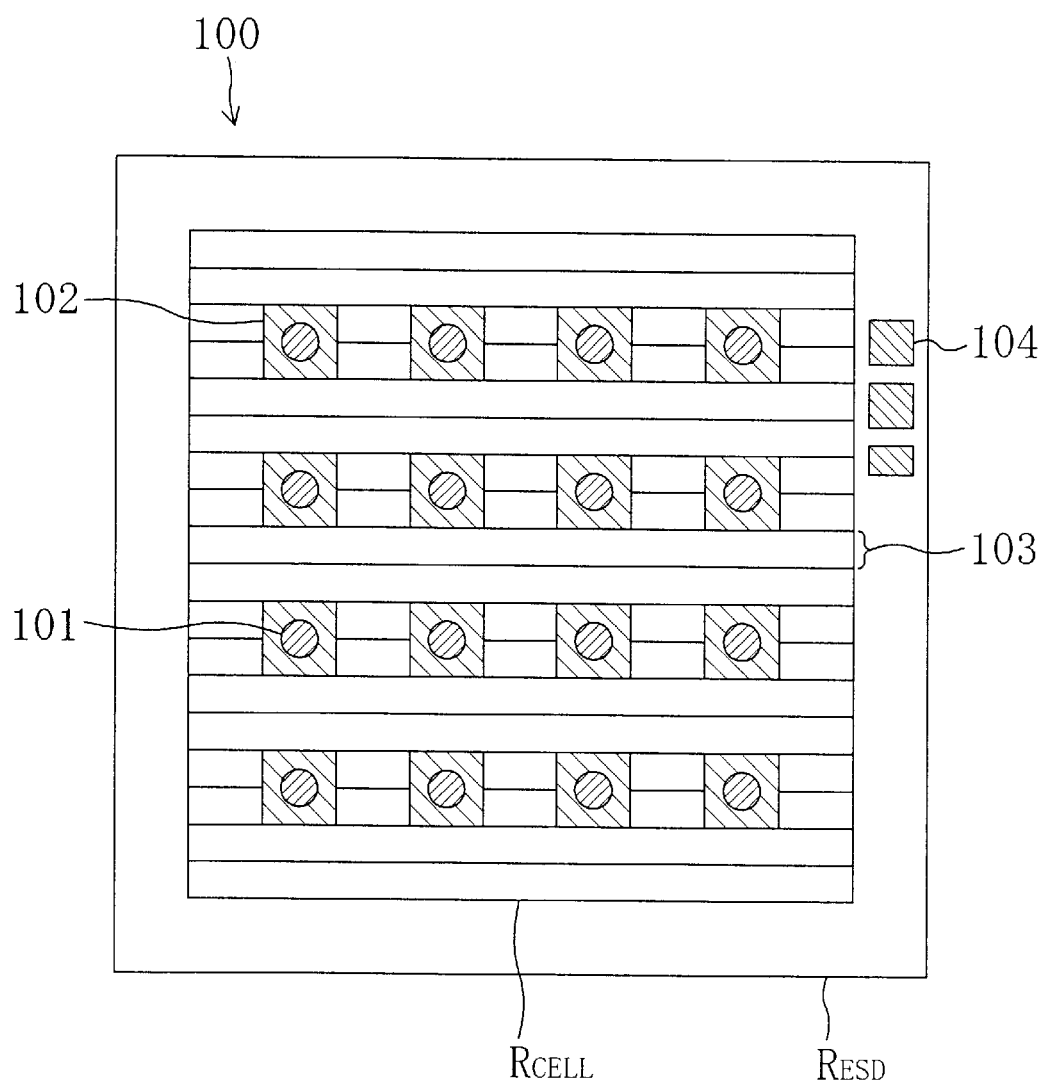
FIG. 1 is a diagram for showing the layout of a semiconductor integrated circuit device according to Embodiment 1 of the invention.

FIG. 1 is a diagram for showing the layout of the semiconductor integrated circuit device of Embodiment 1.

As is shown in FIG. 1, a plurality of bumps (area bumps) 101 are arranged in the form of a matrix within a chip 100, and a plurality of I/O cells 102 are provided below the respective bumps 101 in the chip 100 so as to be inserted between cell lines 103 corresponding to lines of internal circuit cells (not shown), namely, so as to be buried between the internal circuit cells. In this manner, the semiconductor integrated circuit device of Embodiment 1 has an area bump structure.

As characteristics of the semiconductor integrated circuit device of Embodiment 1, an ESD protection circuit 104 separated from each of the I/O cells 102 is disposed in an ESD protection circuit region $R_{ESD}$ provided in a peripheral portion of the chip 100 and the I/O cells 102 are disposed closer to the center of the chip 100 than the ESD protection circuit region $R_{ESD}$.

Furthermore, an internal circuit cell region $R_{CELL}$ where the internal circuit cells are disposed extends over an area of the chip 100 inside of the ESD protection circuit region $R_{ESD}$.

The I/O cells 102 are connected to the corresponding ESD protection circuits 104 separated from the I/O cells 102 through wires not shown. At this point, when the multi-layer interconnection technique is employed, the wires for connecting the I/O cells 102 to the ESD protection circuits 104 (hereinafter referred to as the ESD protection wires) can be formed in the uppermost interconnection layer alone, whereas when the ESD protection wires are difficult to provide in the uppermost interconnection layer alone, they may be provided in an interconnection layer other than the uppermost interconnection layer.

Now, the I/O cell 102 and the ESD protection circuit 104 will be described in detail with reference to FIGS. 2 and 3.

Figure 2:
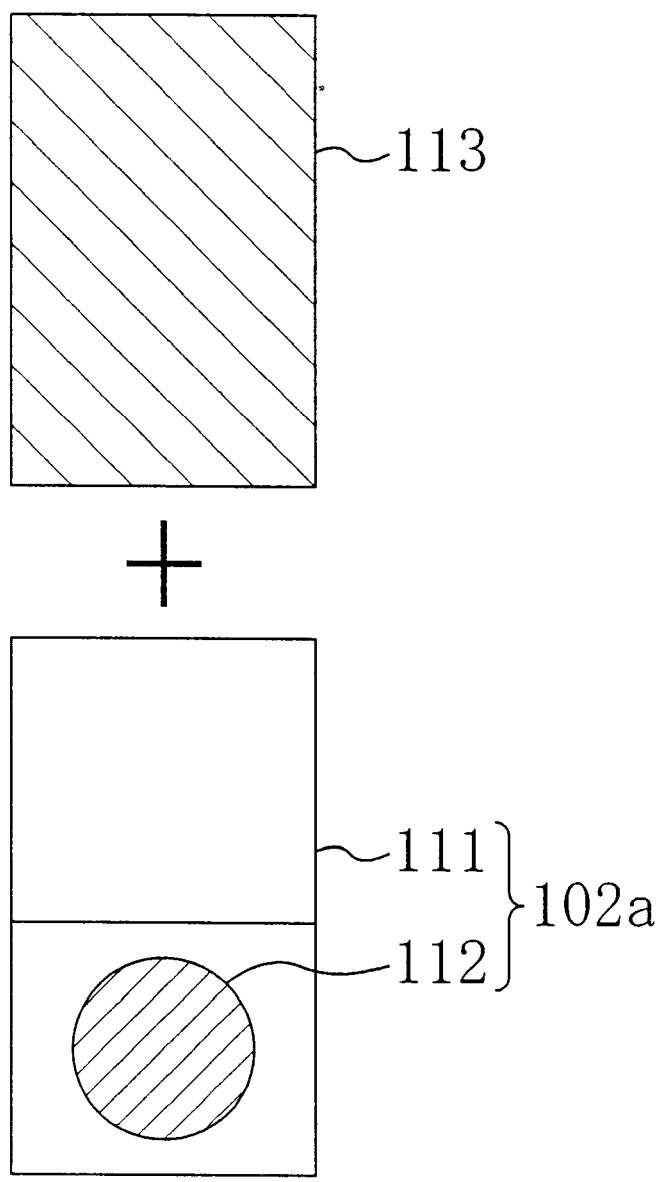
FIG. 2 is a schematic diagram for showing the layout of an input cell and an ESD protection circuit separated from the input cell used in the semiconductor integrated circuit device of Embodiment 1.

FIG. 2 is a schematic diagram for showing the layout of an input cell and an ESD protection circuit separated from the input cell used in the semiconductor integrated circuit device of Embodiment 1.

As is shown in FIG. 2, the input cell 102a includes a first partial circuit 111 composed of an input buffer and a logic circuit, and an input pad 112. The input pad 112 is connected to a corresponding bump 101 by soldering or the like. Also, the input cell 102a is separated from the whole of the corresponding input ESD protection circuit 113.

Figure 3:
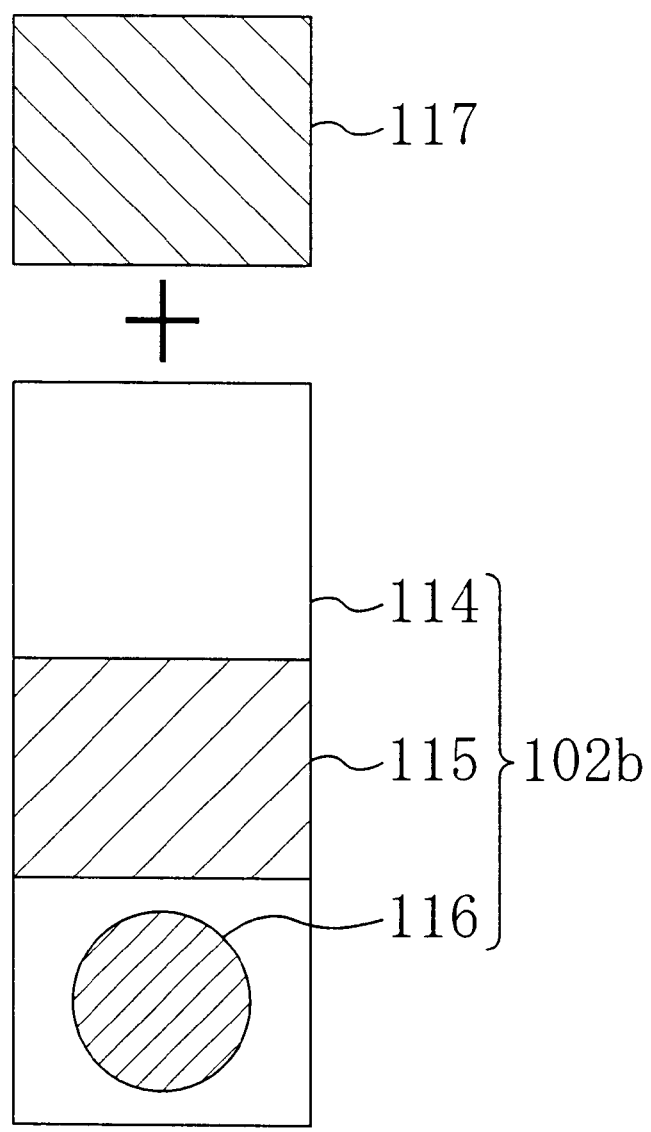
FIG. 3 is a schematic diagram for showing the layout of an output cell and an ESD protection circuit separated from the output cell used in the semiconductor integrated circuit device of Embodiment 1.

FIG. 3 is a schematic diagram for showing the layout of an output cell and an ESD protection circuit separated from the output cell used in the semiconductor integrated circuit device of Embodiment 1.

As is shown in FIG. 3, the output cell 102b includes a second partial circuit 114 composed of an output pre-buffer and a logic circuit, an output buffer/ESD protection circuit 115 corresponding to a part also working as an output buffer of the corresponding output ESD protection circuit, and an output pad 116. The output pad 116 is connected to a corresponding bump 101 by soldering or the like. The output cell 102b is separated from a part not working as the output buffer of the corresponding output ESD protection circuit, namely, an ESD protection dedicated circuit 117, that is, a part excluding the output buffer/ESD protection circuit 115.

Specifically, the ESD protection circuit 104 (shown in FIG. 1) separated from the I/O cell 102 is the whole of the corresponding input ESD protection circuit 113 when the I/O cell 102 is the input cell 102a, and is merely the ESD protection dedicated circuit 117 of the corresponding output ESD protection circuit when the I/O cell 102 is the output cell 102b.

The output buffer/ESD protection circuit 115 of the output ESD protection circuit works as the output buffer alone during the operation of the LSI, and hence, a distance between the output buffer/ESD protection circuit 115 and the bump 101 should be small in order to transfer a signal to the outside of the chip 100 at a high speed. Accordingly, the output buffer/ESD protection circuit 115 is not separated from the output cell 102b disposed below the bump 101.

As described above, according to Embodiment 1, the ESD protection circuit 104, which occupies the most area of a conventional I/O cell, is separated from the I/O cell 102 and disposed in the ESD protection circuit region $R_{ESD}$ provided in the peripheral portion of the chip 100, and the I/O cells 102 are disposed closer to the center of the chip 100 than the ESD protection circuit region $R_{ESD}$. Therefore, even when the I/O cells 102 are inserted in the internal circuit cell region $R_{CELL}$, the area of the internal circuit cell region $R_{CELL}$ can be reduced as compared with that in a conventional semiconductor integrated circuit device, so as to shorten the total line length of inter-cell wires (wires for connecting the internal circuit cells to each other and wires for connecting the internal circuit cells to the I/O cells 102). As a result, the propagation delay time of signals can be reduced in the entire LSI, so as to realize a high speed operation of the LSI.

Now, the aforementioned effect will be described in detail with reference to FIG. 4.

Figure 4:
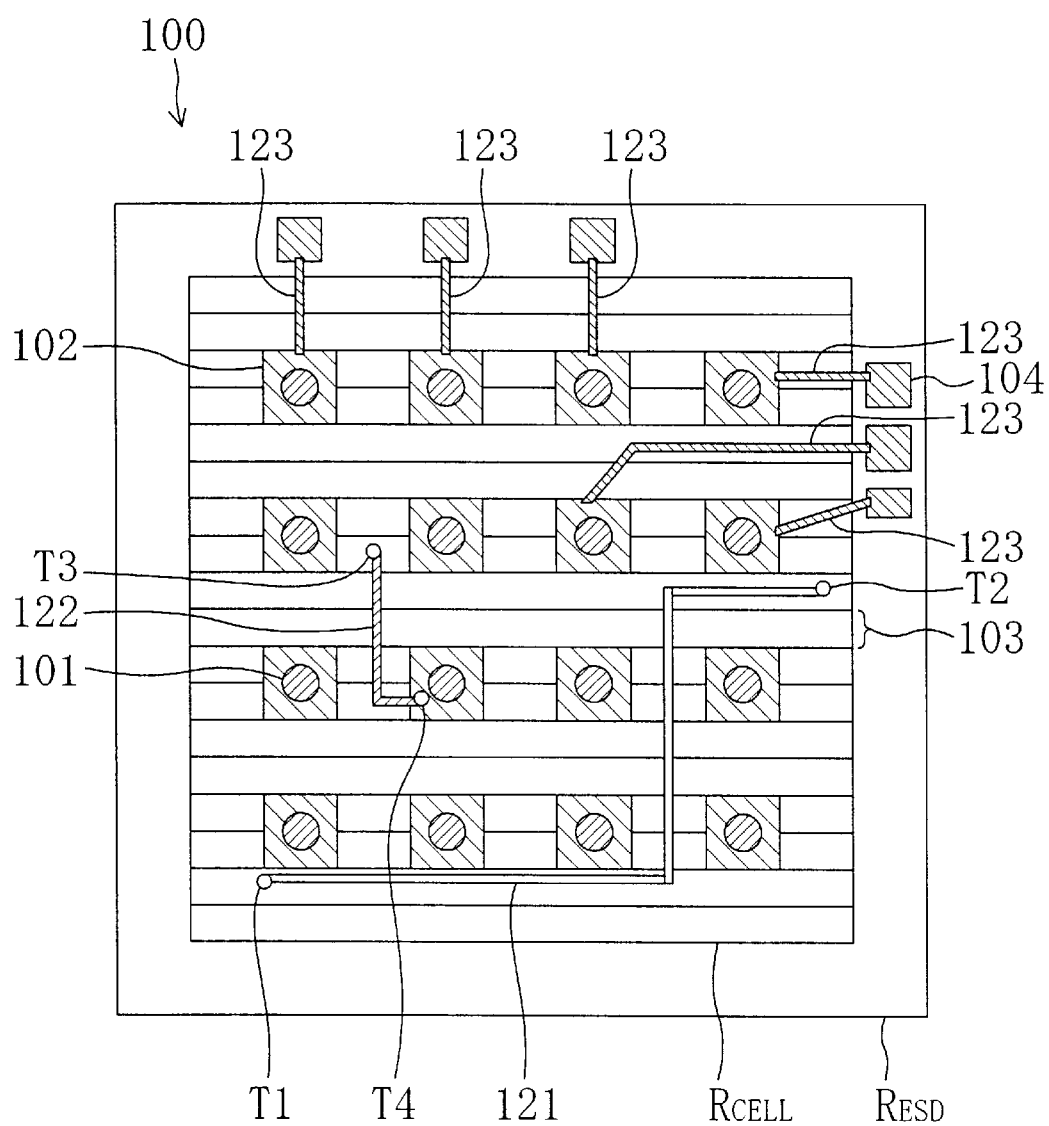
FIG. 4 is a diagram of wires included in the semiconductor integrated circuit device of Embodiment 1.

FIG. 4 is a diagram of wires provided in the semiconductor integrated circuit device of Embodiment 1. In FIG. 4, like reference numerals are used to refer to like elements used in the semiconductor integrated circuit device of Embodiment 1 shown in FIG. 1, so as to omit the description.

As is shown in FIG. 4, the chip 100 includes a first inter-cell wire 121 (extending between terminals T1 and T2) for mutually connecting the internal circuit cells composing the cell lines 103, a second inter-cell wire 122 (extending between terminals T3 and T4) for connecting the internal circuit cell to the I/O cell 102, and an ESD protection wire 123 for connecting the I/O cell 102 to the ESD protection circuit 104. Specifically, all the inter-cell terminals (terminals T1 through T4) used in the inter-cell wires (the first inter-cell wire 121 and the second inter-cell wire 122) are disposed in the internal circuit cell region $R_{CELL}$ having a smaller area than the chip 100.

On the other hand, in a conventional semiconductor integrated circuit device, in the case where the conventional I/O cells including the ESD protection circuits are inserted in the internal circuit cell region, the area of the internal circuit cell region is so large that the entire chip is used as the internal circuit cell region and that inter-cell terminals are disposed on the entire chip.

In Embodiment 1, the total number of ESD protection wires 123 is much smaller than the total number of inter-cell wires, and hence, the ESD protection wires 123 can be provided in the uppermost interconnection layer alone. As a result, there is no need to provide an additional interconnection region for the ESD protection wires 123 on the chip 100, and thus, the area of the chip 100 can be substantially equal to the area of a conventional chip having the same function as that of Embodiment 1.

Accordingly, in the semiconductor integrated circuit device of Embodiment 1, the region where the inter-cell terminals are disposed can be smaller than in the conventional semiconductor integrated circuit device. In addition, since the total line length of inter-cell wires is generally smaller as a distance between inter-cell terminals is smaller, the total line length of inter-cell wires is smaller in the semiconductor integrated circuit device of Embodiment 1 than in the conventional semiconductor integrated circuit device.

Furthermore, in the semiconductor integrated circuit device of Embodiment 1, when the I/O cell 102 is the input cell 102a, the whole of the corresponding input ESD protection circuit is separated from the I/O cell 102 to be disposed in the ESD protection circuit region $R_{ESD}$ and is connected to the I/O cell 102 through the wire. As a result, the area of the internal circuit cell region $R_{CELL}$ is further reduced.

Moreover, in the semiconductor integrated circuit device of Embodiment 1, when the I/O cell 102 is the output cell 102b, merely the ESD protection dedicated circuit corresponding to the part not working as the output buffer of the corresponding output ESD protection circuit is separated from the I/O cell 102 to be disposed in the ESD protection circuit region $R_{ESD}$ and is connected to the I/O cell 102 through the wire. As a result, the area of the internal circuit cell region $R_{CELL}$ can be reduced without increasing the signal transfer time between the I/O cell 102 and the bump 101.

The I/O cell 102 is disposed below the bump 101 in the chip 100 in Embodiment 1, which does not limit the invention. The I/O cell 102 may be disposed in another position in the chip 100.

Furthermore, the ESD protection circuit region $R_{ESD}$ is provided so as to surround the region where the I/O cells 102 are disposed, namely, the internal circuit cell region $R_{CELL}$, in Embodiment 1, which does not limit the invention. The same effect can be obtained even when the ESD protection circuit region $R_{ESD}$ is provided in a portion farther from the center of the chip 100 than the internal circuit cell region $R_{CELL}$.

Although the I/O cell 102 is the input cell 102a or the output cell 102b in Embodiment 1, the I/O cell 102 may be a power cell instead. In this case, the whole of a corresponding power ESD protection circuit is preferably separated from the power cell to be disposed in the ESD protection circuit region $R_{ESD}$ and connected to the power cell through a wire.

Embodiment 2

A design method for a semiconductor integrated circuit device, specifically a design method for a semiconductor integrated circuit device where an I/O cell can be disposed in a desired position within a chip, according to Embodiment 2 of the invention will now be described with reference to the accompanying drawings.

The design method for a semiconductor integrated circuit device of this embodiment is characterized by use of the I/O cell and the ESD protection circuit separated from the I/O cell (shown in FIGS. 2 and 3) used in the semiconductor integrated circuit device of Embodiment 1.

Figure 5:
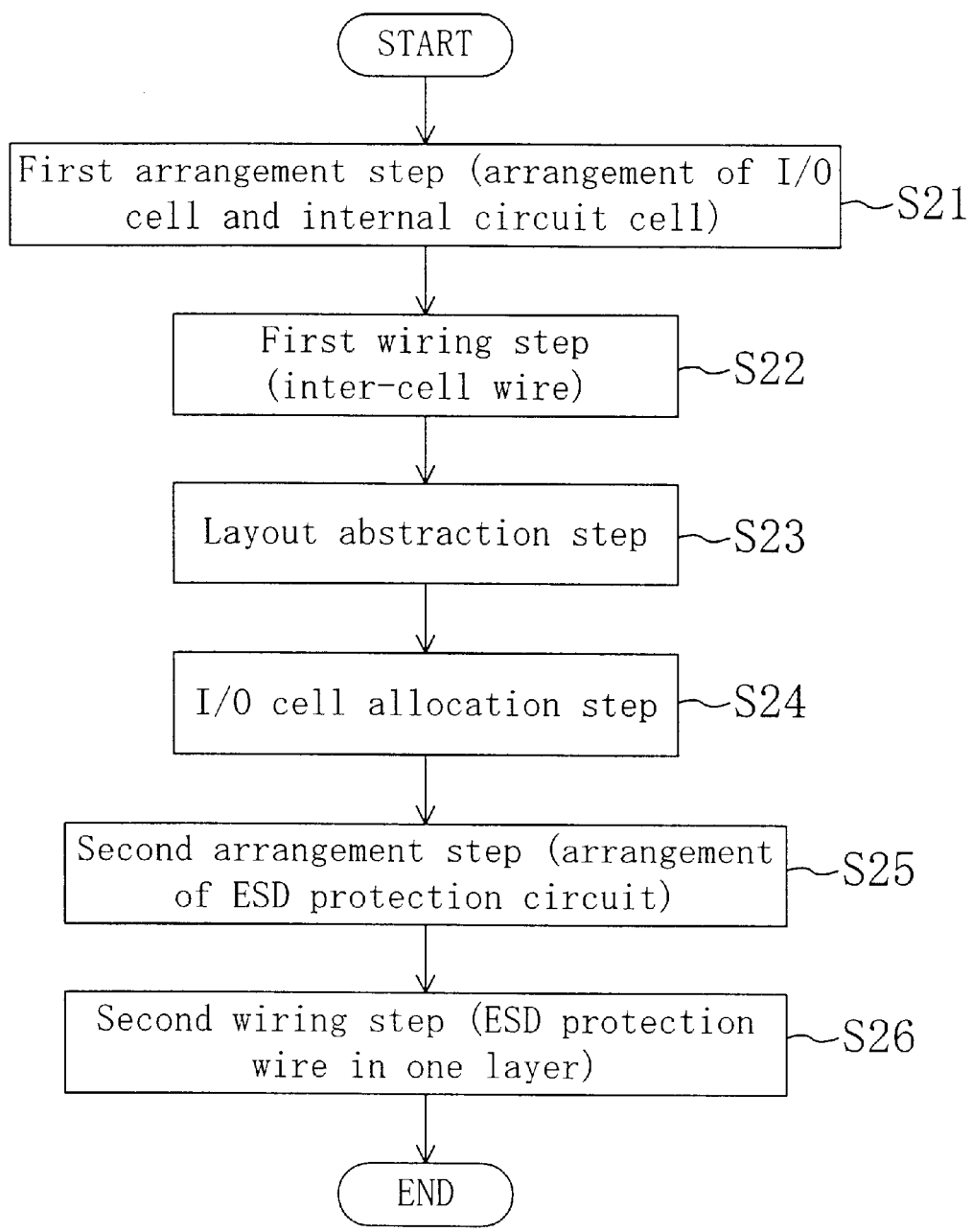
FIG. 5 is a flowchart for showing procedures in a design method for a semiconductor integrated circuit device according to Embodiment 2 of the invention.

FIG. 5 is a flowchart for showing procedures in the design method for a semiconductor integrated circuit device of Embodiment 2.

First, in step S21 (first arrangement step), I/O cells and internal circuit cells are arranged within a chip. Specifically, the I/O cells and the internal circuit cells are optimally arranged by using an objective function for minimizing the total line length of inter-cell wires (wires for connecting the internal circuit cells to each other and wires for connecting the internal circuit cells to the I/O cells) or for minimizing the circuit area, while keeping timing restriction of the circuit in accordance with circuit information.

Each of the I/O cells is disposed below each of bumps (area bumps) arranged in the form of a matrix within the chip so as to be inserted between cell lines corresponding to lines of the internal circuit cells, namely, so as to be buried between the internal circuit cells. Furthermore, the I/O cells are disposed closer to the center of the chip than a region where ESD protection circuits separated from the I/O cells are disposed in a subsequent step (namely, an ESD protection circuit region provided in a peripheral portion of the chip).

Next, in step S22 (first wiring step), the internal circuit cells disposed in the first arrangement step are connected to each other or to the I/O cells through inter-cell wires. Specifically, in accordance with the circuit information, terminals of the internal circuit cells belonging to the same net are connected to each other or terminals of the internal circuit cells are connected to terminals of the I/O cells through the inter-cell wires.

Then, in step S23 (layout abstraction step), the layout is abstracted as preparation for arranging, in the subsequent step, the ESD protection circuits separated from the I/O cells so that ESD protection wires for connecting the I/O cells to the ESD protection circuits can be provided in a single interconnection layer alone.

Figure 6:
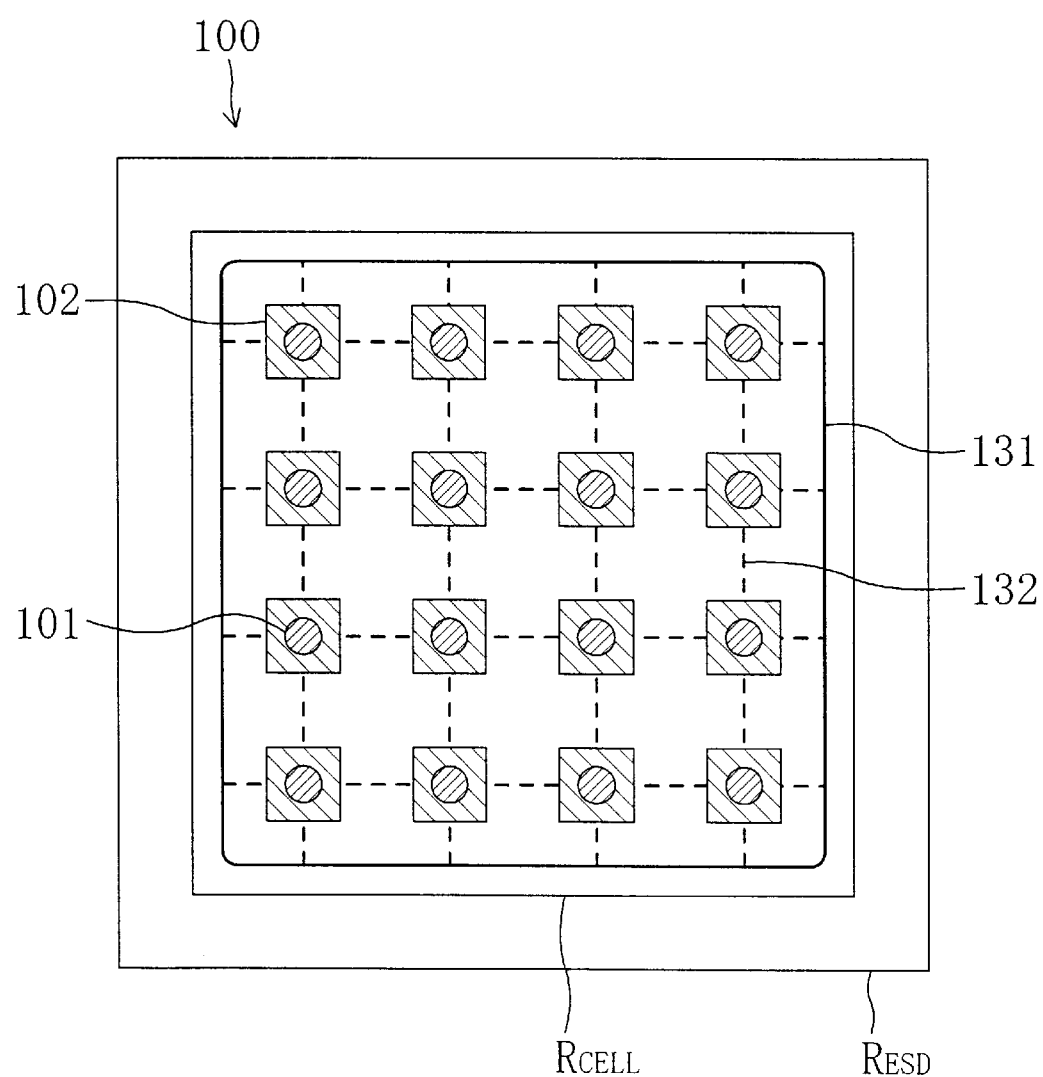
FIG. 6 is a diagram for showing the contents of a layout abstraction step in the design method for a semiconductor integrated circuit device of Embodiment 2.

Now, the layout abstraction step will be described in detail with reference to FIG. 6. In FIG. 6, like reference numerals are used to refer to like elements used in the semiconductor integrated circuit device of Embodiment 1 shown in FIG. 1 so as to omit the description.

In the layout abstraction step, an inclusion line 131 for surrounding all the I/O cells 102 arranged in the first arrangement step and grating lines 132 each having one I/O cell 102 at one end and another I/O cell 102 or the inclusion line 131 on the other end are drawn as is shown in FIG. 6. In Embodiment 2, since the bumps 101, namely, the I/O cells 102, are arranged in the form of a matrix within the chip 100, each of the grating lines 132 extends along a direction horizontal or vertical to one side of the chip 100.

Furthermore, in the layout abstraction step, with respect to each of the grating lines 132, a capacity corresponding to the number of ESD protection wires that can cross the grating line 132 is defined. For example, when a distance between the I/O cells 102 is indicated as d, the pitch of the ESD protection wires is indicated as p, the line width of the ESD protection wire is indicated as w and the line space between the ESD protection wires is indicated as s, the capacity C of a grating line 132 extending between the I/O cells 102 is obtained as follows:

$$C=(d-s)\div p \qquad \text{Formula 1}$$

(whereas p=w+s)

Next, in step S24 (I/O cell allocation step), each of the I/O cells is allocated (made to correspond) to one point on the inclusion line drawn in the layout abstraction step.

Figure 7:
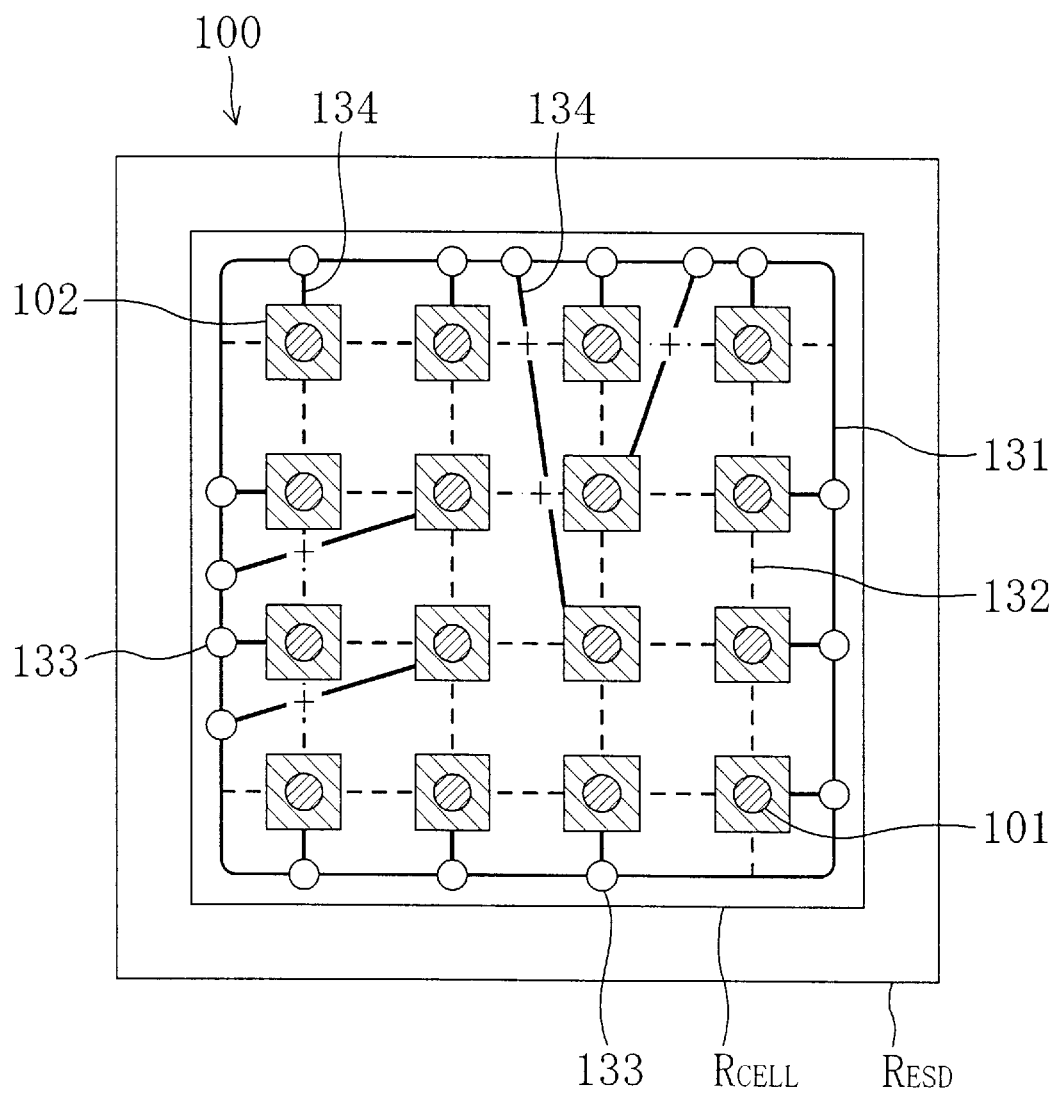
FIG. 7 is a diagram for showing the contents of an I/O cell allocation step in the design method for a semiconductor integrated circuit device of Embodiment 2.

The I/O cell allocation step will now be described in detail with reference to FIG. 7. In FIG. 7, like reference numerals are used to refer to like elements used in the semiconductor integrated circuit device of Embodiment 1 shown in FIG. 1 so as to omit the description.

In the I/O cell allocation step, as is shown in FIG. 7, with respect to each of the I/O cells 102, an I/O cell allocation line 134 extending between the I/O cell 102 and one point on the inclusion line 131, namely, an I/O cell allocation point 133, is drawn in such a manner that the I/O cell allocation line 134 does not cross another I/O cell allocation line and that the number of I/O cell allocation lines 134 crossing each grating line 132 does not exceed the capacity defined in the layout abstraction step. In FIG. 7, the grating line 132 is provided with a plus sign (+) every time the I/O cell allocation line 134 crosses the grating line 132.

Specifically, every time one I/O cell allocation line 134 crosses a grating line 132, the crossing number m of the grating line 132 is increased by one, and when one I/O cell allocation line 134 is to be drawn from one I/O cell 102 toward the inclusion line 131, the path of the I/O cell allocation line 134 is searched for so that the crossing number m of each grating line 132 does not exceed the capacity C defined by Formula 1. In this manner, in connecting the I/O cells 102 to the ESD protection circuits separated from the I/O cells 102 through the ESD protection wires in a subsequent step, the ESD protection wires can be provided in a single interconnection layer alone.

Next, in step S25 (second arrangement step), in accordance with the order of the I/O cells allocated to the respective points on the inclusion line in the I/O cell allocation step, the ESD protection circuits separated from the I/O cells are arranged.

Figure 8:
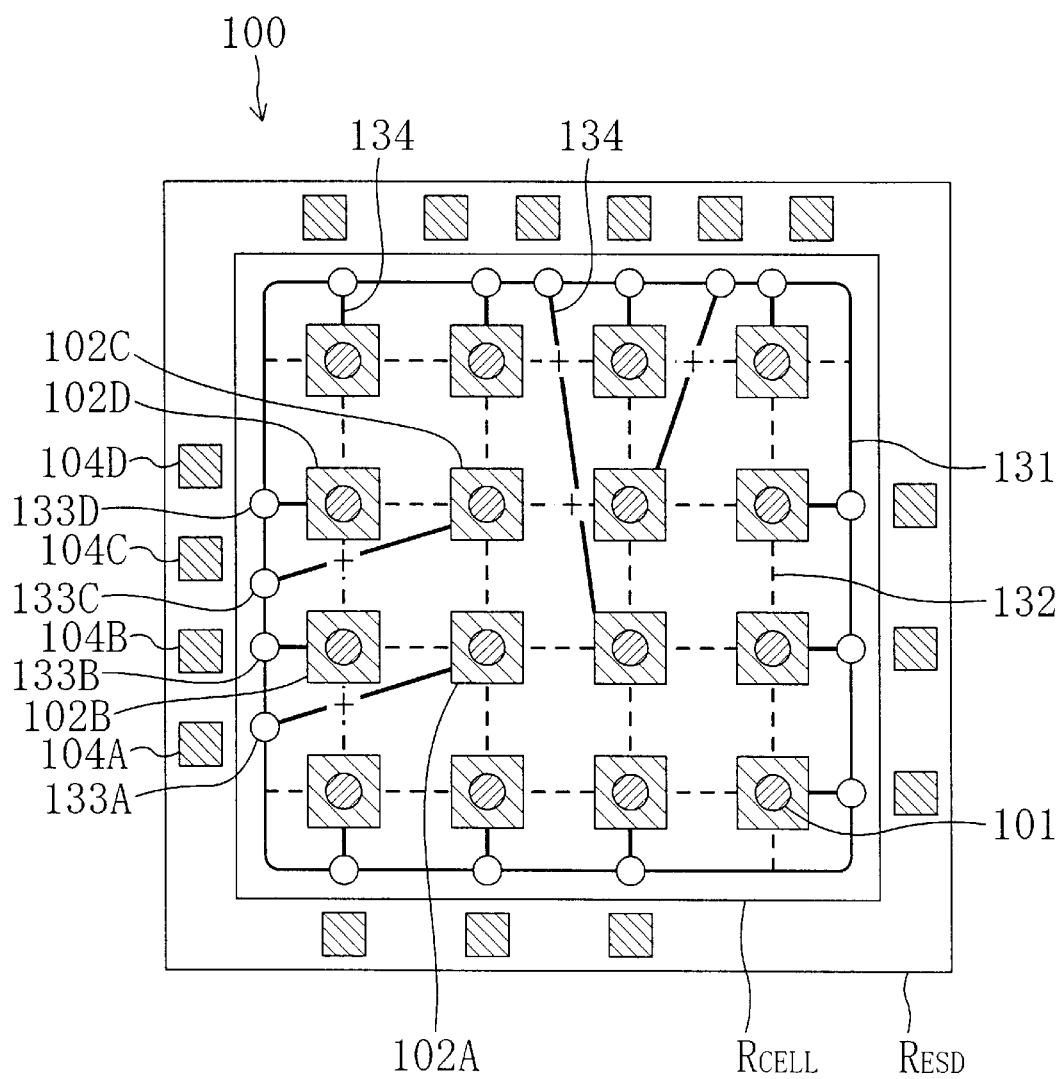
FIG. 8 is a diagram for showing the contents of a second arrangement step in the design method for a semiconductor integrated circuit device of Embodiment 2.

The second arrangement step will now be described in detail with reference to FIG. 8. In FIG. 8, like reference numerals are used to refer to like elements used in the semiconductor integrated circuit device of Embodiment 1 shown in FIG. 1 so as to omit the description.

In the second arrangement step, as is shown in FIG. 8, in accordance with the order of the I/O cells 102 allocated to the respective points on the inclusion line 131 by using the I/O cell allocation lines 134 drawn in the I/O cell allocation step, namely, in accordance with the order of the I/O cell allocation points 133, the ESD protection circuits 104 separated from the I/O cells 102 are arranged in the ESD protection circuit region $R_{ESD}$ provided in the peripheral portion of the chip 100. Specifically, in FIG. 8, a first I/O cell 102A, a second I/O cell 102B, a third I/O cell 102C and a fourth I/O cell 102D respectively correspond to a first I/O cell allocation point 133A, a second I/O cell allocation point 133B, a third I/O cell allocation point 133C and a fourth I/O cell allocation point 133D. Also, the first I/O cell allocation point 133A, the second I/O cell allocation point 133B, the third I/O cell allocation point 133C and the fourth I/O cell allocation point 133D are arranged in this order on the inclusion line 131 in the upward direction. Therefore, a first ESD protection circuit 104A, a second ESD protection circuit 104B, a third ESD protection circuit 104C and a fourth ESD protection circuit 104D respectively separated from the first I/O cell 102A, the second I/O cell 102B, the third I/O cell 102C and the fourth I/O cell 102D are arranged in this order in the upward direction in the ESD protection circuit region $R_{ESD}$. Thus, the ESD protection wires can be prevented from crossing one another in connecting the I/O cells 102 to the ESD protection circuits 104 separated from the I/O cells 102 in the subsequent step.

In Embodiment 2, the ESD protection circuit region $R_{ESD}$ is provided so as to surround the internal circuit cell region $R_{CELL}$ where the internal circuit cells are disposed.

Next, in step S26 (second wiring step), the I/O cells arranged in the first arrangement step are connected to the ESD protection circuits arranged in the second arrangement step through the ESD protection wires.

Figure 9:
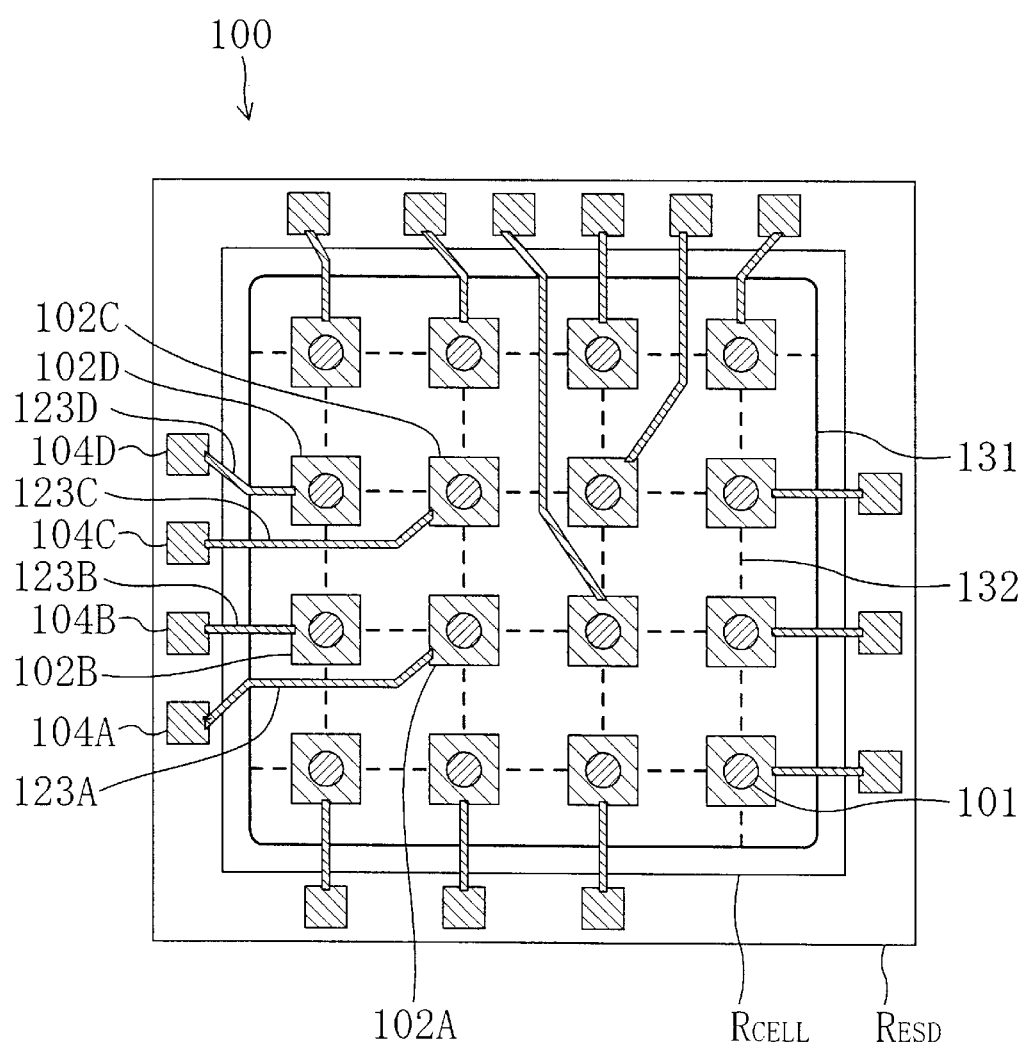
FIG. 9 is a diagram of ESD protection wires provided in a second wiring step of the design method for a semiconductor integrated circuit device of Embodiment 2.

The second wiring step will now be described in detail with reference to FIG. 9. In FIG. 9, like reference numerals are used to refer to like elements used in the semiconductor integrated circuit device of Embodiment 1 shown in FIG. 1 so as to omit the description.

In the second wiring step, as is shown in FIG. 9, the I/O cells 102 arranged in the first arrangement step are connected to the ESD protection circuits 104 arranged to be separated from the I/O cells 102 in the second arrangement step through the ESD protection wires 123 provided in a single interconnection layer, such as the uppermost interconnection layer. Specifically, in FIG. 9, the first I/O cell 102A is connected to the first ESD protection circuit 104A through a first ESD protection wire 123A, the second I/O cell 102B is connected to the second ESD protection circuit 104B through a second ESD protection wire 123B, the third I/O cell 102C is connected to the third ESD protection circuit 104C through a third ESD protection wire 123C and the fourth I/O cell 102D is connected to the fourth ESD protection circuit 104D through a fourth ESD protection wire 123D. At this point, the ESD protection wire 123 includes an oblique wire extending in a direction at 45 degrees against one side of the chip 100.

In Embodiment 2, the ESD protection circuits 104, which occupy the most of the area of the conventional I/O cells, are separated from the I/O cells 102 to be disposed in the ESD protection circuit region $R_{ESD}$ provided in the peripheral portion of the chip 100, and the I/O cells 102 are disposed closer to the center of the chip 100 than the ESD protection circuit region $R_{ESD}$. Therefore, even when the I/O cells 102 are inserted in the internal circuit cell region $R_{CELL}$, the area of the internal circuit cell region $R_{CELL}$ can be reduced as compared with that in a conventional integrated circuit device, so as to reduce the total line length of the inter-cell wires. Accordingly, the propagation delay time of signals can be reduced in the entire LSI, resulting in realizing a high operation speed of the LSI.

Furthermore, according to Embodiment 2, in the layout abstraction step, the inclusion line 131 surrounding all the I/O cells 102 arranged in the first arrangement step and the grating lines 132 each extending between the I/O cells 102 or between the I/O cell 102 and the inclusion line 131 are drawn, and the capacity corresponding to the number of the ESD protection wires 123 permitted to cross the grating line 132 is defined. Then, in the I/O cell allocation step, with respect to each of the I/O cells 102, the I/O cell allocation line 134 extending between the I/O cell 102 and one point on the inclusion line 131 is drawn in a manner that the I/O cell allocation line 134 does not cross another I/O cell allocation line and that the number of the I/O cell allocation lines 134 crossing each grating line 132 does not exceed the capacity. Thereafter, in the second arrangement step, in accordance with the order of the I/O cells 102 allocated to the respective points on the inclusion line 131 by using the I/O cell allocation lines 134, the ESD protection circuits 104 are arranged. Accordingly, the ESD protection circuits 104 separated from the I/O cells 102 can be arranged so that the ESD protection wires 123 can be provided in a single interconnection layer alone. As a result, it is possible to avoid increase of the fabrication cost derived from increase of interconnection layers for providing the ESD protection wires 123.

The I/O cells 102 are disposed below the bumps 101 in the chip 100 in Embodiment 2, which does not limit the invention. The I/O cells 102 may be disposed in other positions in the chip 100.

Furthermore, the ESD protection circuit region $R_{ESD}$ is provided so as to surround the region where the I/O cells 102 are disposed, namely, the internal circuit cell region $R_{CELL}$, in Embodiment 2, which does not limit the invention. The same effect can be obtained when the ESD protection circuit region $R_{ESD}$ is provided in a portion farther from the center of the chip 100 than the internal circuit cell region $R_{CELL}$.

Although the ESD protection wire 123 includes the oblique wire extending in the direction at 45 degrees against one side of the chip 100 in Embodiment 2, the ESD protection wire 123 may include a wire extending merely in a direction horizontal or vertical to one side of the chip 100.

Furthermore, in Embodiment 2, it is possible to use a computer-readable recording medium in which an I/O cell library having at least one ESD protection circuit 104 separated from the I/O cells 102 as a cell different from the I/O cells 102 is recorded. In this manner, the design method for a semiconductor integrated circuit device of Embodiment 2 can be easily practiced by utilizing the I/O cell library recorded in the recording medium on a computer.

Embodiment 3

A design method for a semiconductor integrated circuit device, specifically, a design method for a semiconductor integrated circuit device in which an I/O cell can be disposed in a desired position within a chip, according to Embodiment 3 of the invention will now be described with reference to the accompanying drawings.

The design method for a semiconductor integrated circuit device of Embodiment 3 is characterized by use of the I/O cell and the ESD protection circuit separated from the I/O cell (shown in FIGS. 2 and 3) used in the semiconductor integrated circuit device of Embodiment 1.

Figure 10:
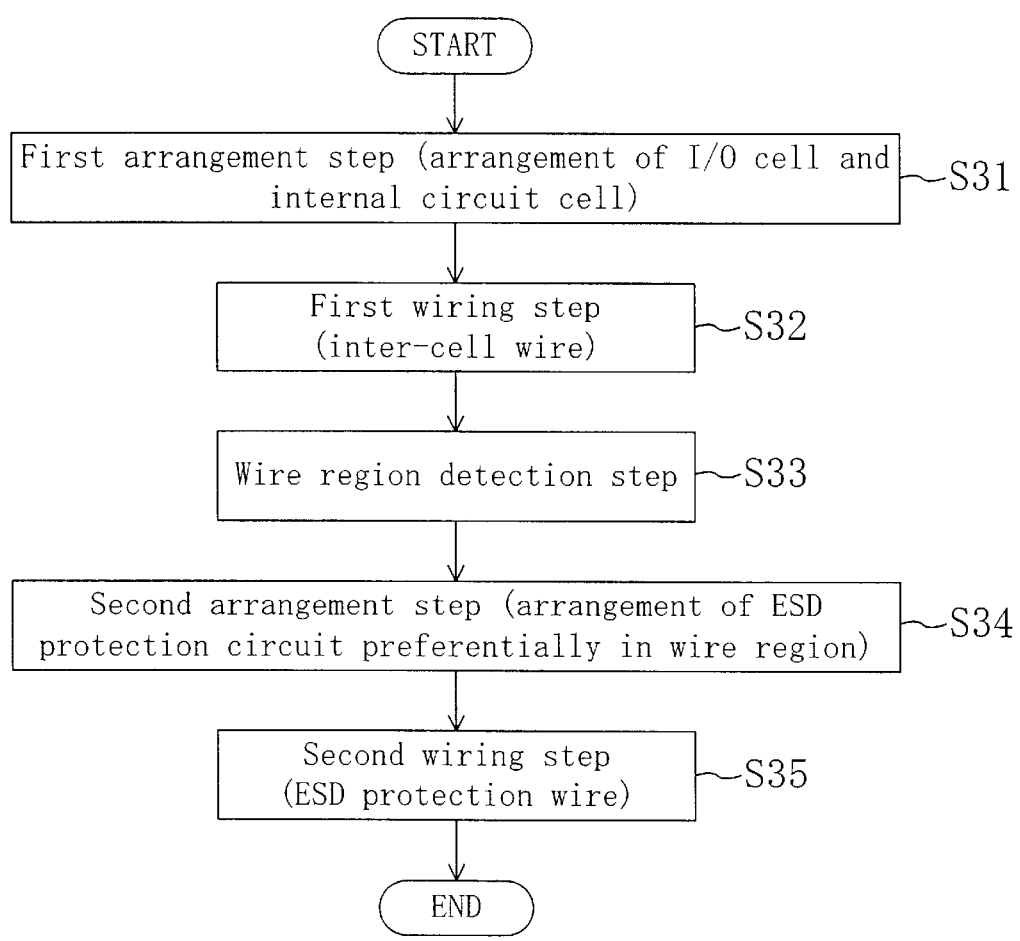
FIG. 10 is a flowchart for showing procedures in a design method for a semiconductor integrated circuit device according to Embodiment 3 of the invention.

FIG. 10 is a flowchart for showing procedures in the design method for a semiconductor integrated circuit device of this embodiment.

First, in step S31 (first arrangement step), I/O cells and internal circuit cells are arranged within a chip in the same manner as in step S21 of Embodiment 2.

Figure 11:
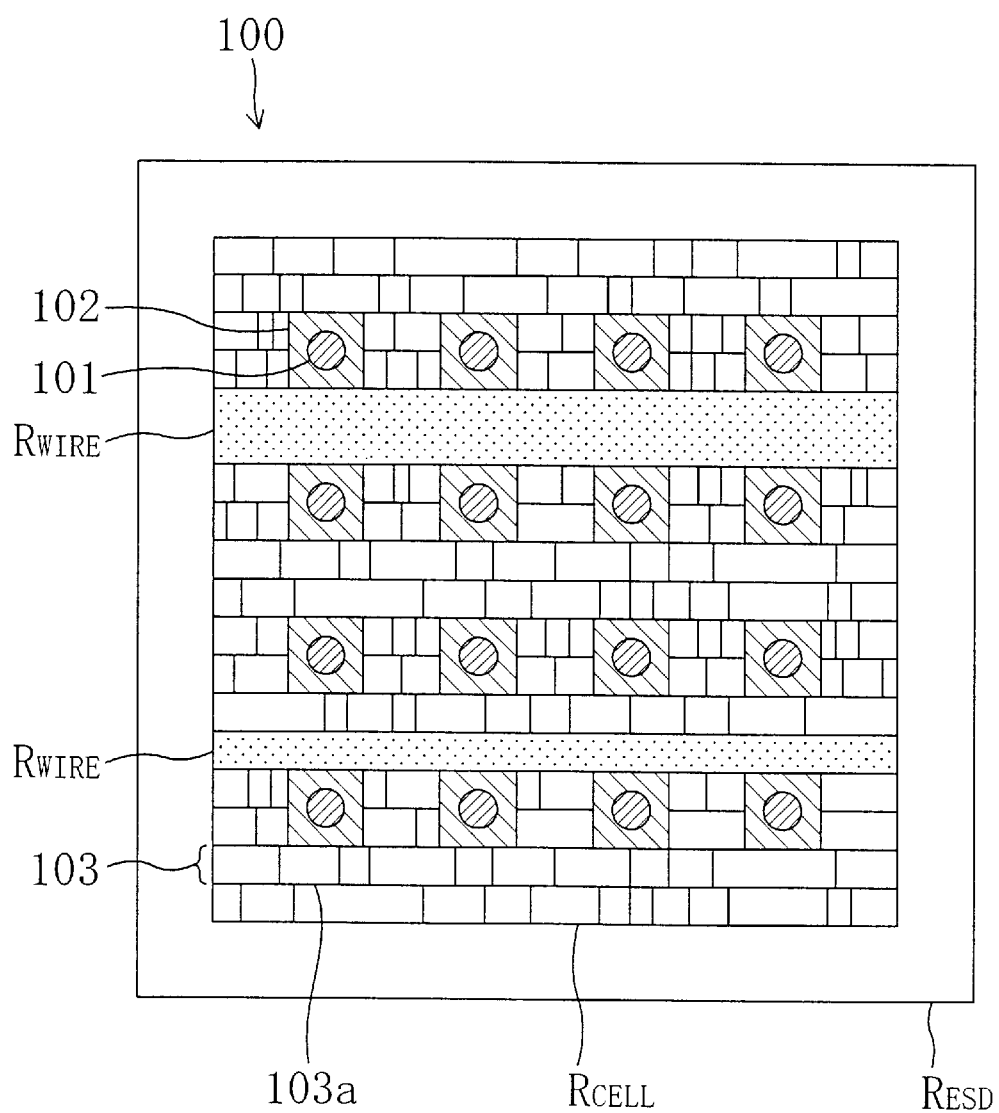
FIG. 11 is a diagram of I/O cells and internal circuit cells provided in a first arrangement step in the design method for a semiconductor integrated circuit device of Embodiment 3.

The first arrangement step will now be described in detail with reference to FIG. 11 by exemplifying the case where the internal circuit cell is a standard cell. In FIG. 11, like reference numerals are used to refer to like elements used in the semiconductor integrated circuit device of Embodiment 1 shown in FIG. 1 so as to omit the description.

In the first arrangement step, as is shown in FIG. 11, the I/O cells 102 and the standard cells 103a are arranged in the same cell lines 103, namely, in standard cell lines. Also, the height of the I/O cell 102 is set to twice of the height of the standard cell 103a, and the I/O cells 102 are arranged over two standard cell lines.

Next, in step S32 (first wiring step), the internal circuit cells arranged in the first arrangement step are connected to each other or to the I/O cells through inter-cell wires in the same manner as in step S22 of Embodiment 2.

The first wiring step will now be described in detail with reference to FIG. 11 by exemplifying the case where the internal circuit cell is a standard cell.

In the first wiring step, the inter-cell wires for connecting the standard cells 103a to each other or to the I/O cells 102 are basically disposed above the cells (the standard cells or the I/O cells). In the case where the inter-cell wires are too long to provide above the cells alone, however, a wire region $R_{WIRE}$ is provided between the cell lines 103 as is shown in FIG. 11, where inter-cell wires that cannot be provided above the cells are disposed.

Next, in step S33 (wire region detection step), the wire region provided in the first wiring step is detected.

Then, in step S34 (second arrangement step), the ESD protection circuits separated from the I/O cells are arranged.

Figure 12:
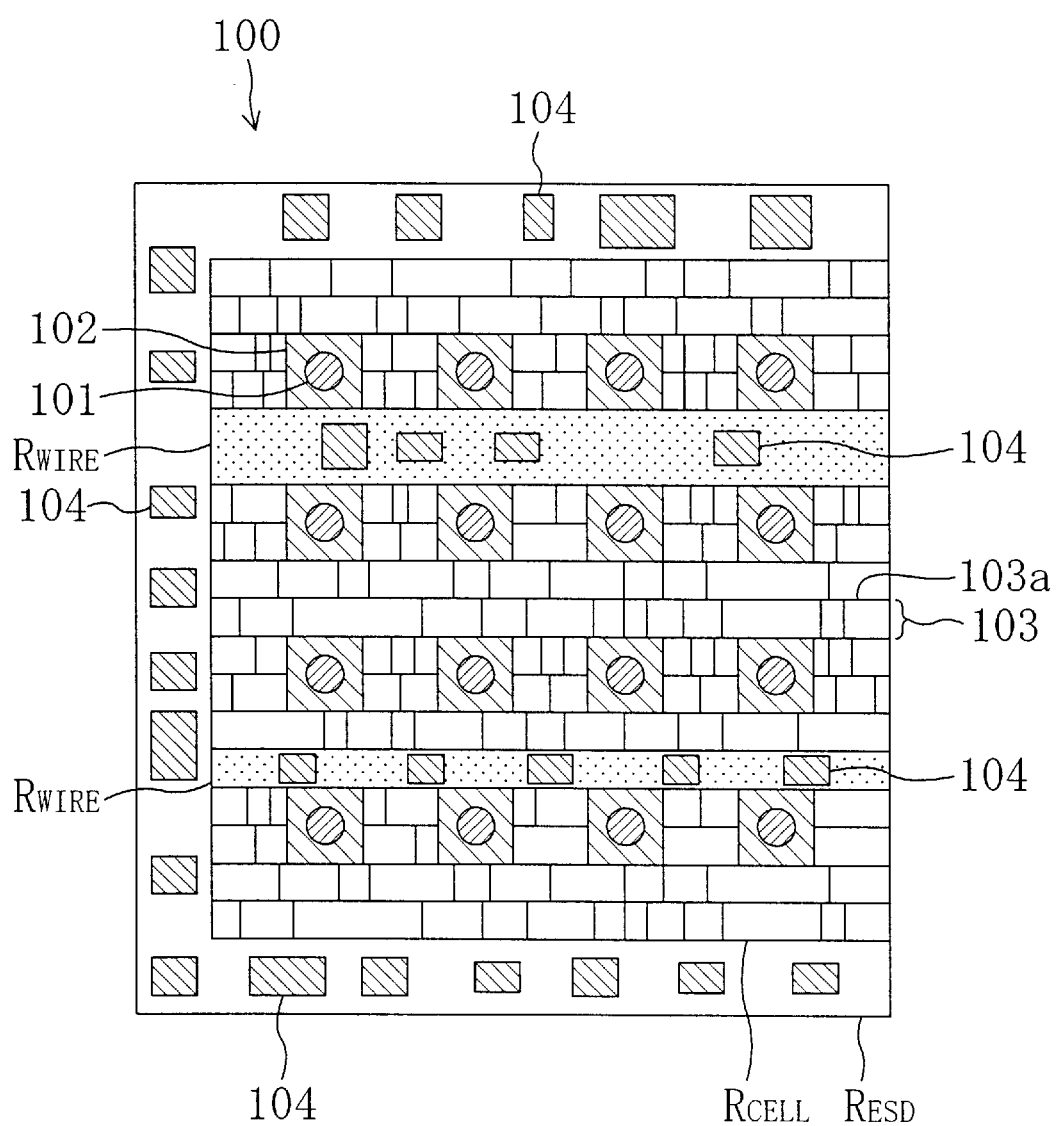
FIG. 12 is a diagram of an ESD protection circuit provided in a second arrangement step in the design method for a semiconductor integrated circuit device of Embodiment 3.
Figure 13:
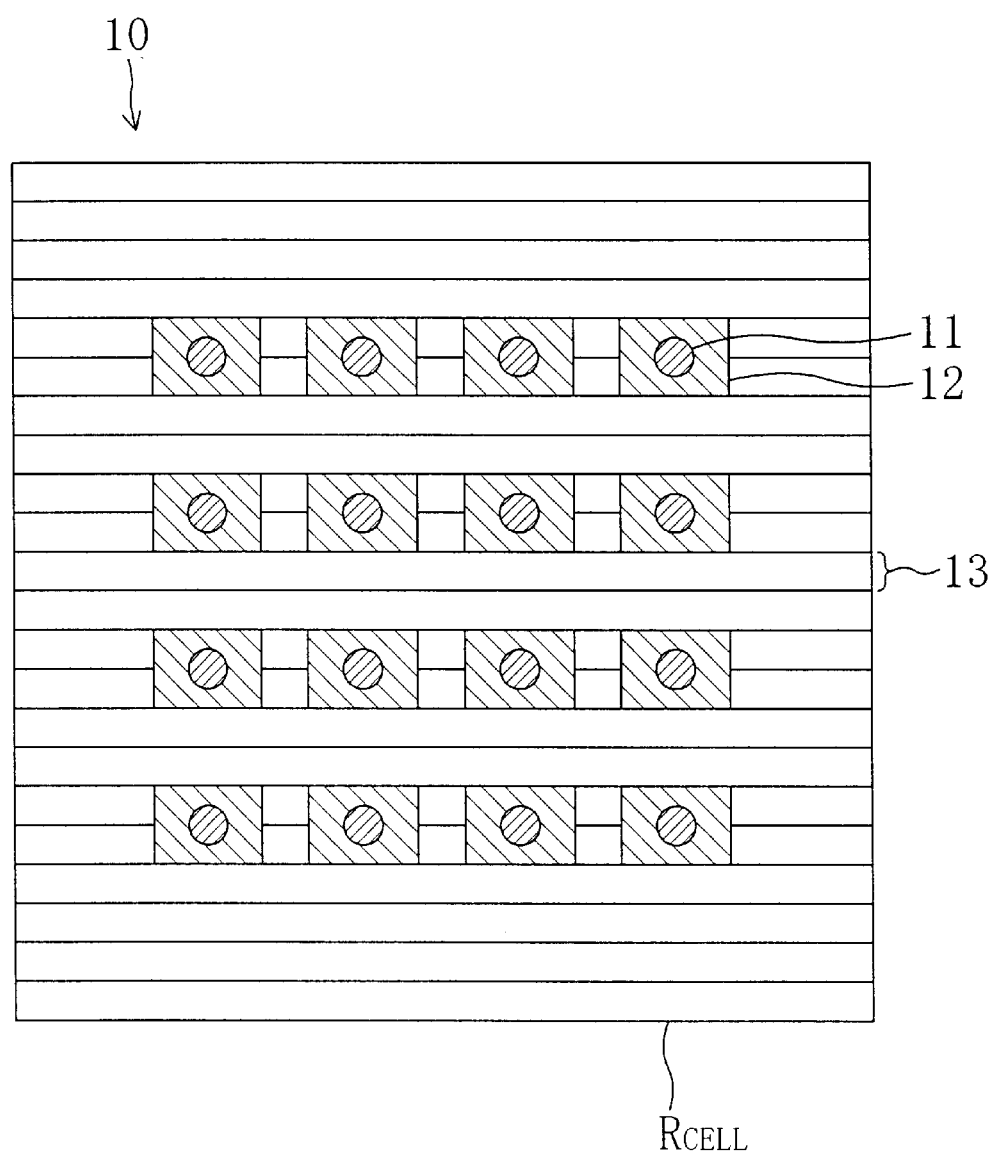
FIG. 13 is a diagram for showing the layout of a conventional semiconductor integrated circuit device.
Figure 14:
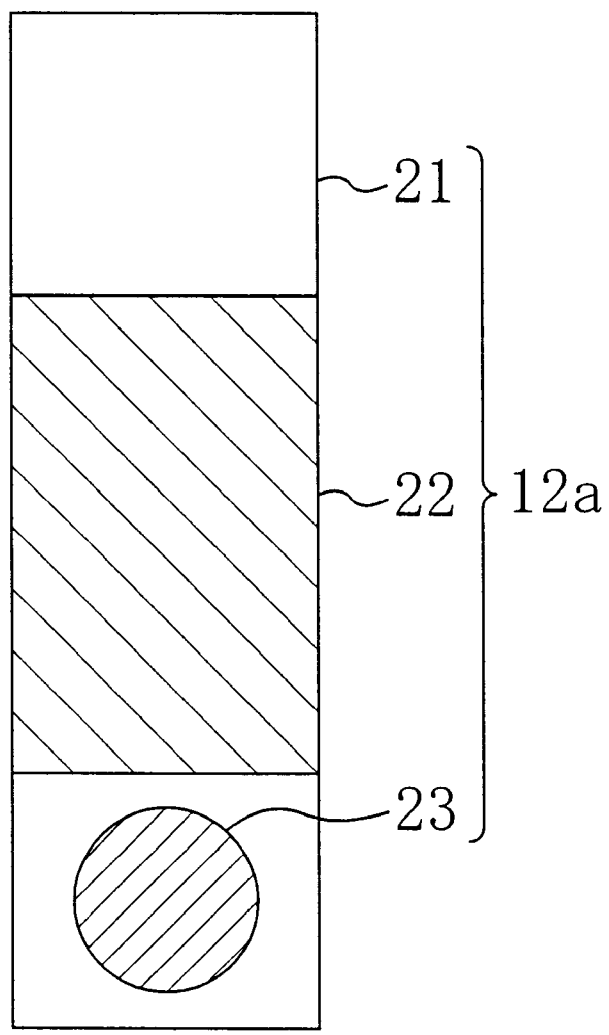
FIG. 14 is a schematic diagram for showing the layout of a conventional input cell.
Figure 15:
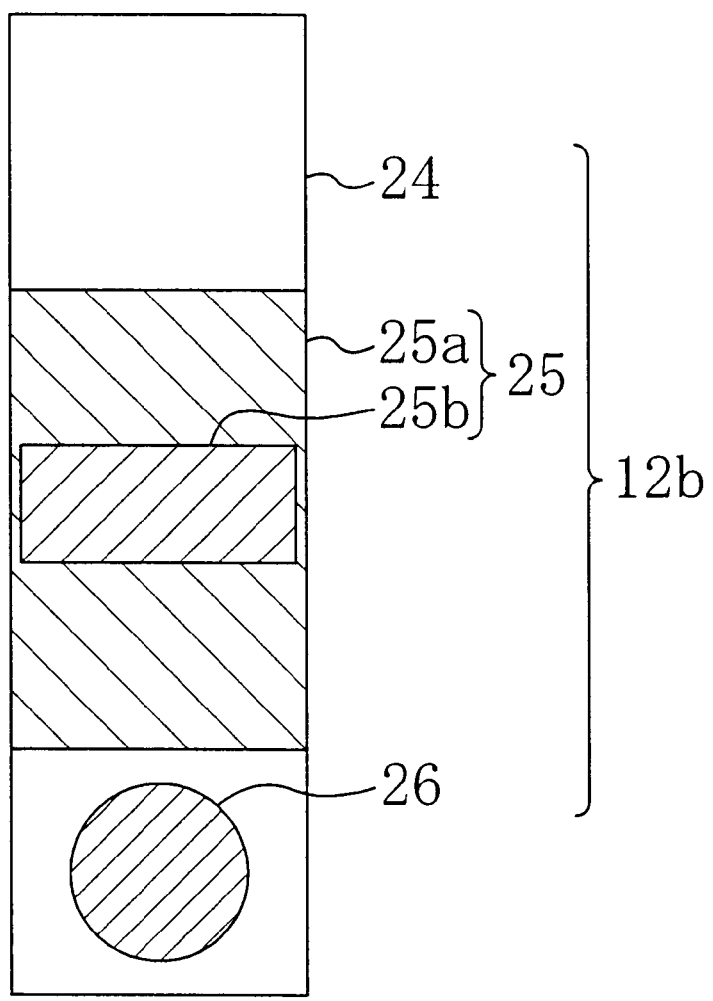
FIG. 15 is a schematic diagram for showing the layout of a conventional output cell.

The second arrangement step will now be described in detail with reference to FIG. 12 by exemplifying the case where the internal circuit cell is a standard cell. In FIG. 12, like reference numerals are used to refer to like elements used in the semiconductor integrated circuit device of Embodiment 1 shown in FIG. 1 so as to omit the description.

In the second arrangement step, as is shown in FIG. 12, the ESD protection circuits 104 separated from the I/O cells 102 are preferentially disposed in the wire region $R_{WIRE}$ detected in the wire region detection step. Subsequently, the ESD protection circuits that cannot be provided in the wire region $R_{WIRE}$ are disposed in an ESD protection circuit region $R_{ESD}$ provided in a peripheral portion of the chip 100. At this point, in order to minimize the area of the chip 100, the ESD protection circuits 104 are not disposed in, for example, a right side portion of the ESD protection circuit region $R_{ESD}$ (shown in FIG. 11), surrounding the internal circuit cell region $R_{CELL}$, on the right hand side of the internal circuit cell region $R_{CELL}$. In this manner, when all the ESD protection circuits 104 are completed to arrange, no ESD protection circuits 104 is disposed on the right side portion of the ESD protection circuit region $R_{ESD}$ on the right hand side of the internal circuit cell region $R_{CELL}$. Therefore, as is shown in FIG. 12, the area of the chip 100 can be reduced by eliminating the right side portion of the ESD protection circuit region $R_{ESD}$ on the right hand side of the internal circuit cell region $R_{CELL}$.

In Embodiment 3, the ESD protection circuits 104, which occupy the most of the area of conventional I/O cells, are separated from the I/O cells 102 to be disposed in the ESD protection circuit region $R_{ESD}$ provided in the peripheral portion of the chip 100, and the I/O cells 102 are disposed closer to the center of the chip 100 than the ESD protection circuit region $R_{ESD}$. Therefore, even when the I/O cells 102 are inserted in the internal circuit cell region $R_{CELL}$, the area of the internal circuit cell region $R_{CELL}$ can be reduced as compared with that in a conventional semiconductor integrated circuit device, so as to reduce the total line length of the inter-cell wires. Accordingly, the propagation delay time of signals can be reduced in the entire LSI, resulting in realizing a high operation speed of the LSI.

Furthermore, according to Embodiment 3, the wire region $R_{WIRE}$ provided in the first wiring step is detected in the wire region detection step, and then, the ESD protection circuits 104 are preferentially disposed in the wire region $R_{WIRE}$ in the second arrangement step. Therefore, the area of the ESD protection circuit region $R_{ESD}$ provided in the peripheral portion of the chip 100 can be reduced. Accordingly, the area of the chip 100 itself can be reduced, resulting in lowering the fabrication cost and improving the yield.

The I/O cells 102 are disposed below the bumps 101 in the chip 100 in Embodiment 3, which does not limit the invention. The I/O cells 102 may be disposed in other positions in the chip 100.

Furthermore, the ESD protection circuit region $R_{ESD}$ is provided so as to surround the region where the I/O cells 102 are disposed, namely, the internal circuit cell region $R_{CELL}$, in Embodiment 3, which does not limit the invention. The same effect can be obtained when the ESD protection circuit region $R_{ESD}$ is provided in a portion farther from the center of the chip 100 than the internal circuit cell region $R_{CELL}$.

Although the height of the I/O cell 102 is set to twice of the height of the standard cell 103a and the I/O cells 102 are arranged over two standard cell lines in Embodiment 3, the same effect can be obtained by setting the I/O cell 102 to another height.

Furthermore, in Embodiment 3, it is possible to use a computer-readable recording medium in which an I/O cell library having at least one ESD protection circuit 104 separated from the I/O cells 102 as a cell different from the I/O cells 102 is recorded. In this manner, the design method for a semiconductor integrated circuit device of Embodiment 3 can be easily practiced by utilizing the I/O cell library recorded in the recording medium on a computer.

What is claimed is:

1. A semiconductor integrated circuit device, comprising:
   at least one I/O cell disposed on a chip, said chip including an internal circuit cell region defined such that internal circuitry of said chip extends up to an outermost periphery of said internal circuit cell region, said at least one I/O cell disposed in said internal circuit cell region;
   an ESD protection circuit, at least a portion of said ESD protection circuit being separated from said at least one I/O cell and disposed in an ESD protection circuit region provided in a peripheral portion of said chip;
   said at least one I/O cell disposed closer to a center of said chip than said ESD protection circuit region; and
   a wire for connecting said at least one I/O cell to said ESD protection circuit.

2. The semiconductor integrated circuit device of claim 1, wherein the whole of said ESD protection circuit is separated from said at least one I/O cell to be disposed in said ESD protection circuit region and is connected to said at least one I/O cell through said wire.

3. The semiconductor integrated circuit device of claim 1, wherein said at least a portion of said ESD protection circuit includes an ESD protection dedicated circuit corresponding to a portion of said ESD protection circuit not working as an output buffer, said ESD protection dedicated circuit being separated from said at least one I/O cell to be disposed in said ESD protection circuit region and is connected to said at least one of I/O cell through said wire.

4. A design method for a semiconductor integrated circuit device, comprising:
   a first arrangement step of arranging a plurality of I/O cells and one or more internal circuit cells in an internal circuit cell region of a chip defined such that internal circuitry of said chip extends up to an outermost periphery of said internal circuit cell region;
   a first wiring step of connecting said one or more internal circuit cells arranged in said first arrangement step to each other or to said plurality of I/O cells through inter-cell wires;
   a second arrangement step of arranging one or more ESD protection circuits such that at least a portion of said one or more ESD protection circuits are separated from said plurality of I/O cells in an ESD protection circuit region provided in a peripheral portion of said chip; and
   a second wiring step of connecting said plurality of I/O cells arranged in said first arrangement step to said one or more ESD protection circuits arranged in said second arrangement step through ESD protection wires,
   wherein said plurality of I/O cells are disposed closer to a center of said chip than said ESD protection circuit region in said first arrangement step.

5. A design method for a semiconductor integrated circuit device, comprising:
   a first arrangement step of arranging a plurality of I/O cells and one or more internal circuit cells within a chip;
   a first wiring step of connecting said one or more internal circuit cells arranged in said first arrangement step to each other or to said plurality of I/O cells through inter-cell wires;
   a second arrangement step of arranging one or more ESD protection circuits separated from said plurality of I/O cells in an ESD protection circuit region provided in a peripheral portion of said chip; and
   a second wiring step of connecting said plurality of I/O cells arranged in said first arrangement step to said one or more ESD protection circuits arranged in said second arrangement step through ESD protection wires,
   wherein said plurality of I/O cells are disposed closer to a center of said chip than said ESD protection circuit region in said first arrangement step,
   said design method further comprising, between said first wiring step and said second arrangement step,
   a layout abstraction step of drawing an inclusion line surrounding all of said I/O cells arranged in said first arrangement step and grating lines each extending between said I/O cells or between one of said I/O cells and said inclusion line, and defining a capacity of every grating line corresponding to the number of ESD protection wires permitted to cross said grating line; and
   an I/O cell allocation step of drawing, with respect to every I/O cell, an I/O cell allocation line extending between said I/O cell and a point on said inclusion line in a manner that said I/O cell allocation line does not cross another I/O cell allocation line and that the number of I/O cell allocation lines crossing every grating line does not exceed said capacity,
   wherein said one or more ESD protection circuits are disposed in accordance with the order of said I/O cells each allocated to one point on said inclusion line by using said I/O cell allocation lines in said second arrangement step, and
   said ESD protection wires are provided in a single interconnection layer alone in said second wiring step.

6. The design method for a semiconductor integrated circuit device of claim 4,
   wherein said first wiring step includes a sub-step of providing, within said chip, a wire region where said inter-cell wires are disposed,
   the design method further includes, between said first wiring step and said second arrangement step, a wire region detection step of detecting said wire region provided in said first wiring step, and
   said second arrangement step includes a sub-step of disposing said ESD protection circuits in said wire region detected in said wire region detection step.

7. A computer-readable recording medium in which an I/O cell library corresponding to a set of I/O cells for externally inputting a signal to or outputting a signal from a semiconductor integrated circuit is recorded, said I/O cell library including at least one ESD protection circuit separated from said I/O cells as a cell different from said I/O cells.

8. The semiconductor integrated circuit device of claim 2, wherein said at least one I/O cell is an input cell and/or a power cell.

9. The semiconductor integrated circuit device of claim 3, wherein said at least one I/O cell is an output cell.

10. The semiconductor integrated circuit device of claim 1, wherein said at least one I/O cell includes a plurality of I/O cells, at least two adjacent I/O cells of said plurality of I/O cells has internal circuitry of said chip located therebetween.

11. The semiconductor integrated circuit device of claim 1, wherein at least a portion of the internal circuitry of said chip is positioned between said at least one I/O cell and said outermost periphery of said internal circuit cell region.

12. The semiconductor integrated circuit device of claim 1, wherein said ESD protection circuit region surrounds said internal circuit cell region.

13. The semiconductor integrated circuit device of claim 1, wherein an output buffer portion of said ESD protection circuit is not separated from said at least one I/O cell.

14. A semiconductor integrated circuit device, comprising:
   at least one I/O cell disposed on a chip, said chip including an internal circuit cell region defined such that internal circuitry of said chip extends up to an outermost periphery of said internal circuit cell region;
   an ESD protection circuit;
   a wire for connecting said at least one I/O cell to said ESD protection circuit; and
   at least one wire region extending through said internal circuit cell region and adapted to have inter-cell wires, which can not be provided above said at least one I/O cell or said internal circuitry, disposed therein.

15. The semiconductor integrated circuit device of claim 14, wherein at least a portion of said ESD protection circuit is separated from said at least one I/O cell and disposed in an ESD protection circuit region provided in a peripheral portion of said chip.

16. The semiconductor integrated circuit device of claim 14, wherein said at least one I/O cell is disposed in said internal circuit cell region.

17. The semiconductor integrated circuit device of claim 14, wherein at least a portion of said ESD protection circuit is disposed in said at least one wire region.

18. The semiconductor integrated circuit device of claim 17, wherein said ESD protection circuit region only partially surrounds said internal circuit cell region.

19. The semiconductor integrated circuit device of claim 17, wherein at least a portion of said ESD protection circuit is separated from said at least one I/O cell.

20. The semiconductor integrated circuit device of claim 17, wherein at least another portion of said ESD protection circuit is separated from said at least one I/O cell and disposed in an ESD protection circuit region provided in a peripheral portion of said chip.

* * * * *

UNITED STATES PATENT AND TRADEMARK OFFICE
CERTIFICATE OF CORRECTION

PATENT NO. : 6,560,759 B2  Page 1 of 1
DATED : May 6, 2003
INVENTOR(S) : Noriko Shinomiya It is certified that error appears in the above-identified patent and that said Letters Patent is hereby corrected as shown below:

<u>Title page, Item [54] and Column 1, line 4,</u>
Change "WHERE MEDIUM" to -- MEDIUM WHERE --

Signed and Sealed this

Thirtieth Day of September, 2003

JAMES E. ROGAN
*Director of the United States Patent and Trademark Office*